(12) United States Patent
Han et al.

(10) Patent No.: US 11,700,761 B2
(45) Date of Patent: *Jul. 11, 2023

(54) MANUFACTURING METHOD OF DISPLAY APPARATUS UTILIZING DAM PORTION AND DISPLAY APPARATUS MANUFACTURED USING THE METHOD

(71) Applicant: Samsung Display Co., Ltd., Yongin-si (KR)

(72) Inventors: Mijung Han, Yongin-si (KR); Heena Kim, Yongin-si (KR); Sangjin Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 140 days.

This patent is subject to a terminal disclaimer.

(21) Appl. No.: 17/129,580

(22) Filed: Dec. 21, 2020

(65) Prior Publication Data
US 2021/0151718 A1     May 20, 2021

Related U.S. Application Data

(63) Continuation of application No. 16/437,792, filed on Jun. 11, 2019, now Pat. No. 10,886,505.

(30) Foreign Application Priority Data

Aug. 9, 2018    (KR) .................. 10-2018-0093138

(51) Int. Cl.
    *H01L 51/56*       (2006.01)
    *H10K 71/00*      (2023.01)
    *H10K 59/12*      (2023.01)

(52) U.S. Cl.
    CPC .............. *H10K 71/00* (2023.02); *H10K 59/12* (2023.02); *H10K 59/1201* (2023.02)

(58) Field of Classification Search
    CPC ........... H01L 2227/323; H01L 27/3244; H01L 51/56; H10K 59/12; H10K 59/1201; H10K 59/352; H10K 59/353; H10K 71/00
See application file for complete search history.

(56) References Cited

U.S. PATENT DOCUMENTS

| | | |
|---|---|---|
| 7,754,602 B2 | 7/2010 | Jeon |
| 8,501,566 B1 | 8/2013 | Chou et al. |
| 10,211,430 B2 * | 2/2019 | Jeong ...................... H01L 51/56 |

(Continued)

FOREIGN PATENT DOCUMENTS

| | | |
|---|---|---|
| CN | 109935616 A | 6/2019 |
| KR | 10-0831250 B1 | 5/2008 |

(Continued)

*Primary Examiner* — Jaehwan Oh
(74) *Attorney, Agent, or Firm* — Lewis Roca Rothgerber Christie LLP

(57) ABSTRACT

A manufacturing method of a display apparatus, in which a defect rate in a manufacturing process is reduced and product reliability is increased, and a display apparatus manufactured according to the method are provided. The manufacturing method includes: forming a first pixel electrode on a substrate; forming an insulating layer; forming a first dam portion; forming a first lift-off layer; forming a first mask layer; forming a first intermediate layer; forming a first opposite electrode; forming a first insulating protective layer; and removing the first dam portion.

20 Claims, 10 Drawing Sheets

(56) References Cited

U.S. PATENT DOCUMENTS

| | | | |
|---|---|---|---|
| 10,297,656 B2* | 5/2019 | Cho | H01L 27/3279 |
| 10,325,970 B2 | 6/2019 | Bang et al. | |
| 2010/0213522 A1 | 8/2010 | Cheng et al. | |
| 2014/0353633 A1* | 12/2014 | Lee | H10K 59/121 |
| | | | 438/34 |
| 2015/0001495 A1* | 1/2015 | Choung | H10K 71/18 |
| | | | 257/40 |
| 2017/0104181 A1* | 4/2017 | Lee | H10K 59/122 |
| 2017/0358633 A1 | 12/2017 | Park et al. | |
| 2017/0365812 A1 | 12/2017 | Choung et al. | |
| 2018/0358584 A1 | 12/2018 | Jeong et al. | |
| 2019/0189706 A1 | 6/2019 | Choi | |
| 2019/0334112 A1* | 10/2019 | Lee | H10K 50/844 |
| 2020/0119114 A1 | 4/2020 | Kim et al. | |

FOREIGN PATENT DOCUMENTS

| | | |
|---|---|---|
| KR | 10-2017-0142231 A | 12/2017 |
| KR | 2017/0140486 | 12/2017 |
| KR | 10-2020-0042996 A | 4/2020 |

* cited by examiner

MANUFACTURING METHOD OF DISPLAY APPARATUS UTILIZING DAM PORTION AND DISPLAY APPARATUS MANUFACTURED USING THE METHOD

CROSS-REFERENCE TO RELATED APPLICATIONS

This application is a continuation of U.S. patent application Ser. No. 16/437,792, filed Jun. 11, 2019, which claims priority to and the benefit of Korean Patent Application No. 10-2018-0093138, filed Aug. 9, 2018, the entire content of both of which is incorporated herein by reference.

BACKGROUND

1. Field

One or more embodiments relate to a display apparatus and a manufacturing method of the display apparatus, and more particularly, to a manufacturing method of a display apparatus in which a defect rate in the manufacturing process is reduced and product reliability is increased, a display apparatus manufactured using the method, and a display apparatus amenable to being manufactured according to a method yielding a reduced defect rate and increased product reliability.

2. Description of the Related Art

Among display apparatuses, organic light-emitting display apparatuses have wide viewing angles, high contrast, and fast response speeds, and thus are drawing attention as a next-generation display apparatus.

An organic light-emitting display apparatus typically includes a thin film transistor and organic light-emitting elements on a substrate, and the organic light-emitting elements emit light themselves. An organic light-emitting element may include a pixel electrode, an opposite electrode facing the pixel electrode, and an emissive layer between the pixel electrode and the opposite electrode. Organic light-emitting display apparatuses are used as display units of compact products such as mobile phones or as display units of large-size products such as televisions.

For an organic light-emitting display apparatus implementing full color, light of different colors is emitted from different pixel areas, and an emissive layer of each pixel and an opposite electrode integrally formed in a plurality of pixels may be formed using a deposition mask. As the resolution of organic light-emitting display apparatuses gradually increases, the width of an open slit of a mask used during a deposition process gradually decreases and there is a demand for dispersion thereof to be gradually reduced. Furthermore, to manufacture a high-resolution organic light-emitting display apparatus, there is a demand to reduce or remove a shadow effect. Accordingly, a deposition process may be performed in which a substrate and a mask are in close contact with each other.

SUMMARY

One or more embodiments include a manufacturing method of an organic light-emitting display apparatus, whereby a defect rate during a manufacturing process is reduced and product reliability is enhanced, and the organic light-emitting display apparatus manufactured by using the manufacturing method. However, the above objective is an example, and the scope of the present disclosure is not limited by said objective.

Additional aspects may be set forth in part in the description which follows and, in part, may be apparent from the description.

According to one or more embodiments, a method of manufacturing a display apparatus, includes: forming a first pixel electrode for emission of a first color, a second pixel electrode for emission of a second color, and a third pixel electrode for emission of a third color on a substrate; forming an insulating layer, the insulating layer covering edges of the first pixel electrode and having a first opening exposing a center portion of the first pixel electrode, the insulating layer covering edges of the second pixel electrode and having a second opening exposing a center portion of the second pixel electrode, the insulating layer covering edges of the third pixel electrode and having a third opening exposing a center portion of the third pixel electrode; forming a first dam portion on the insulating layer around the first opening; forming a first lift-off layer on the insulating layer around the outside of the first dam portion such that the first lift-off layer covers the second pixel electrode and the third pixel electrode and comprises an opening exposing the first pixel electrode; forming a first mask layer on the first lift-off layer, the first mask layer having a first open portion corresponding to the first opening; forming a first intermediate layer on the first pixel electrode through the first open portion; forming a first opposite electrode on the first intermediate layer through the first open portion; forming a first insulating protective layer on the first opposite electrode through the first open portion; and removing the first mask layer, the first lift-off layer, and the first dam portion.

The first dam portion and the first mask layer may include a same material.

The removing of the first mask layer, the first lift-off layer, and the first dam portion may include simultaneously removing the first mask layer, the first lift-off layer, and the first dam portion by using a first solution.

A height of the first dam portion may be equal to a height of the first lift-off layer.

An edge of the first mask layer around the first open portion may have an undercut shape protruding beyond the first dam portion toward the first opening.

An upper surface of the first dam portion may contact a lower surface of the first mask layer such that the first dam portion supports the first mask layer from below.

The first dam portion and the first lift-off layer may be spaced apart from each other.

The method may further include, before forming the first dam portion, patterning an auxiliary electrode on the insulating layer.

The first opposite electrode may directly contact the auxiliary electrode to electrically connect to the auxiliary electrode.

The first insulating protective layer may be formed of an inorganic insulating material.

An end of the first insulating protective layer may be spaced apart from the first dam portion.

A height of the first dam portion may be less than a height of the first lift-off layer.

The first dam portion and the first mask layer may contact each other.

The first lift-off layer may include a fluorous solvent base resin.

The first dam portion may have a closed loop shape surrounding the first opening.

The method may further include, after removing the first mask layer, the first lift-off layer, and the first dam portion: forming a second dam portion on the insulating layer around the second opening; forming a second lift-off layer on the insulating layer around the outside of the second dam portion such that the second lift-off layer covers the first pixel electrode and the third pixel electrode and comprises an opening exposing the second pixel electrode; forming a second mask layer on the second lift-off layer, the second mask layer having a second open portion corresponding to the second opening; forming a second intermediate layer on the second pixel electrode through the second open portion; forming a second opposite electrode on the second intermediate layer through the second open portion; forming a second insulating protective layer on the second opposite electrode through the second open portion; and simultaneously removing the second mask layer, the second lift-off layer, and the second dam portion by using an identical etching solution.

The second dam portion and the second mask layer may include a same material.

The method may further include, after removing the second mask layer, the second lift-off layer, and the second dam portion: forming a third dam portion on the insulating layer around the third opening; forming a third lift-off layer on the insulating layer around the outside of the third dam portion such that the third lift-off layer covers the first pixel electrode and the second pixel electrode and comprises an opening exposing the third pixel electrode; forming a third mask layer on the third lift-off layer, the third mask layer having a third open portion corresponding to the third opening; forming a third intermediate layer on the third pixel electrode through the third open portion; forming a third opposite electrode on the third intermediate layer through the third open portion; forming a third insulating protective layer on the third opposite electrode through the third open portion; and simultaneously removing the third mask layer, the third lift-off layer, and the third dam portion by using an identical etching solution.

The third dam portion and the third mask layer may include a same material.

A display apparatus manufactured using the method described above is provided.

In addition to the aforesaid details, other aspects, features, and advantages will be clarified from the following drawings, claims, and detailed description.

These general and specific embodiments may be implemented by using a system, a method, a computer program, or a combination of the system, the method, and the computer program.

These and/or other aspects will become apparent and more readily appreciated from the following description of embodiments of the present disclosure, taken in conjunction with the accompanying drawings.

DETAILED DESCRIPTION

Figure 1:
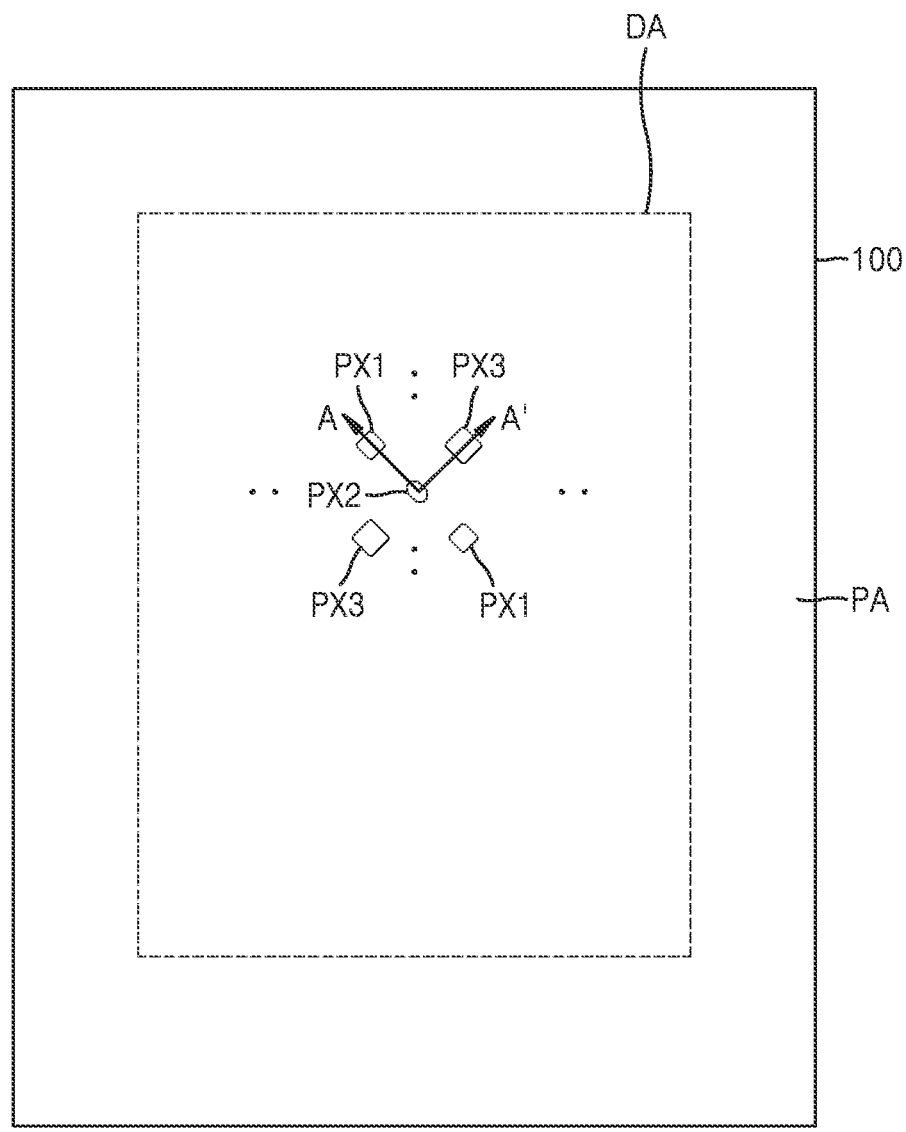
FIG. 1 is a plan view of a display apparatus according to an embodiment of the present disclosure.

Reference will now be made in detail to embodiments of the present disclosure, examples of which are illustrated in the accompanying drawings. The present disclosure and the inventive aspects thereof can, however, be embodied in different forms. The present disclosure should therefore not be construed as being limited to the descriptions set forth herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity. As used herein, the term "and/or" includes any and all combinations of one or more of the associated listed items. Expressions such as "at least one of," when preceding a list of elements, modify the entire list of elements and do not modify the individual elements of the list.

Since the present disclosure may have various modifications and several embodiments, embodiments are shown in the drawings and will be described in detail. Effects, features, and a method of achieving the same will be specified with reference to the embodiments described below in detail together with the attached drawings. However, the embodiments may have different forms and should not be construed as being limited to the descriptions set forth herein.

While such terms as "first," "second," etc., may be used to describe various components, elements, regions, layers and/or sections, such components must not be limited to the above terms. The above terms are used only to distinguish one component from another. Thus, a first element, component, region, layer or section described below could be termed a second element, component, region, layer or section, without departing from the spirit and scope of the present invention.

An expression used in the singular encompasses the expression of the plural, unless it has a clearly different meaning in the context.

In the embodiments below, it will be further understood that the terms "comprise" and/or "have" used herein specify the presence of stated features or components, but do not preclude the presence or addition of one or more other features or components.

In the embodiments below, it will be understood when a portion such as a layer, an area, or an element is referred to as being "on" or "above" another portion, it can be directly on or above the other portion, or intervening portion may also be present.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Sizes of components in the drawings may be exaggerated or contracted for convenience of explanation. For example, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the embodiments below, when a layer, an area, or an element is "connected", it may be construed that the layer, area, or element is connected not only directly but also through other constituent elements interposed therebetween. For example, when a layer, an area, or an element is "electrically connected", it may be in direct contact or may be in contact through other constituent elements interposed therebetween.

As discussed above, deposition processes may be performed with a substrate and a mask in close contact with each other, for example to manufacture a high-resolution OLED apparatus or to reduce or remove a shadow effect. When a deposition process is performed with a substrate and a mask are in close contact with each other, the mask may damage layers on a pixel electrode.

FIG. 1 is a plan view of a display apparatus (or a substrate of a display apparatus) according to an embodiment of the present disclosure.

The display apparatus includes a display area DA where an image may be displayed and a peripheral area PA outside the display area DA, as illustrated in FIG. 1. FIG. 1 may be understood as illustrating a substrate 100 included in the display apparatus. For example, it may be understood that the substrate 100 includes the display area DA and the peripheral area PA.

In the display area DA, pixels emitting different colors from each other are arranged. For example, FIG. 1 illustrates first through third pixels PX1, PX2, and PX3 emitting red, green, and blue light, respectively. While FIG. 1 illustrates the first through third pixels PX1, PX2, and PX3 in a staggered arrangement (e.g., a PenTile arrangement used in some Samsung Display Co., Ltd. products), the arrangement of pixels may be modified in various manners without departing from the scope of the present disclosure, and the present disclosure is not limited to any particular arrangement.

The peripheral area PA may be a non-display area in which a driver, a power voltage supply line, or the like used to provide pixels with an electrical signal or power may be arranged. The peripheral area PA may include a pad which is an area to which an electronic device or a printed circuit board or the like may be electrically connected.

Figure 2:
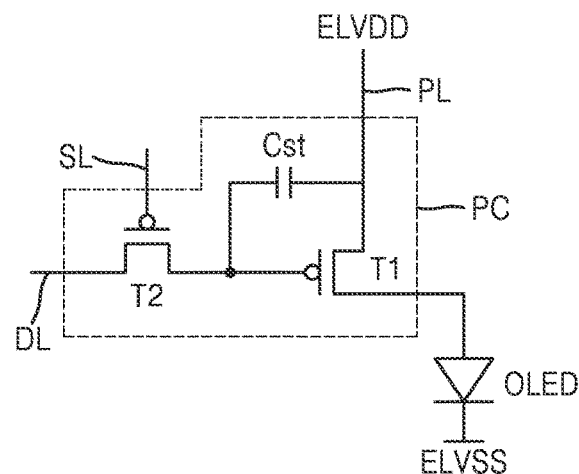
FIG. 2 is an equivalent circuit diagram of a pixel of a display apparatus according to an embodiment of the present disclosure.

FIG. 2 is an equivalent circuit diagram of a pixel of a display apparatus according to an embodiment of the present disclosure.

Referring to FIG. 2, the pixel includes a pixel circuit PC and a display device connected to the pixel circuit PC. An organic light-emitting diode OLED is illustrated as a display device in FIG. 2. The pixel circuit PC may include a first thin film transistor T1, a second thin film transistor T2, and a storage capacitor Cst.

The second thin film transistor T2 is a switching thin film transistor, is connected to a scan line SL and a data line DL, and transfers, to the first thin film transistor T1, a data voltage input via the data line DL according to a switching voltage input via the scan line SL. The storage capacitor Cst is connected to the second thin film transistor T2 and a driving voltage line PL and stores a voltage corresponding to the difference between a voltage received from the second thin film transistor T2 and a first power voltage ELVDD supplied to the driving voltage line PL.

The first thin film transistor T1 is a driving thin film transistor, is connected to the driving voltage line PL and the storage capacitor Cst, and may control a driving current Id flowing through the organic light-emitting diode OLED from the driving voltage line PL in accordance with a voltage value stored in the storage capacitor Cst. The organic light-emitting diode OLED may emit light having a brightness via a driving current Id. An opposite electrode (for example, a cathode) of the organic light-emitting diode OLED may receive a second power voltage ELVSS.

With reference to FIG. 2, it is described that the pixel circuit PC includes two thin film transistors and one storage capacitor, but the present disclosure is not limited thereto. The number of thin film transistors and the number of storage capacitors may be varied according to a design of the pixel circuit PC without departing from the scope of the present disclosure.

Figure 3:
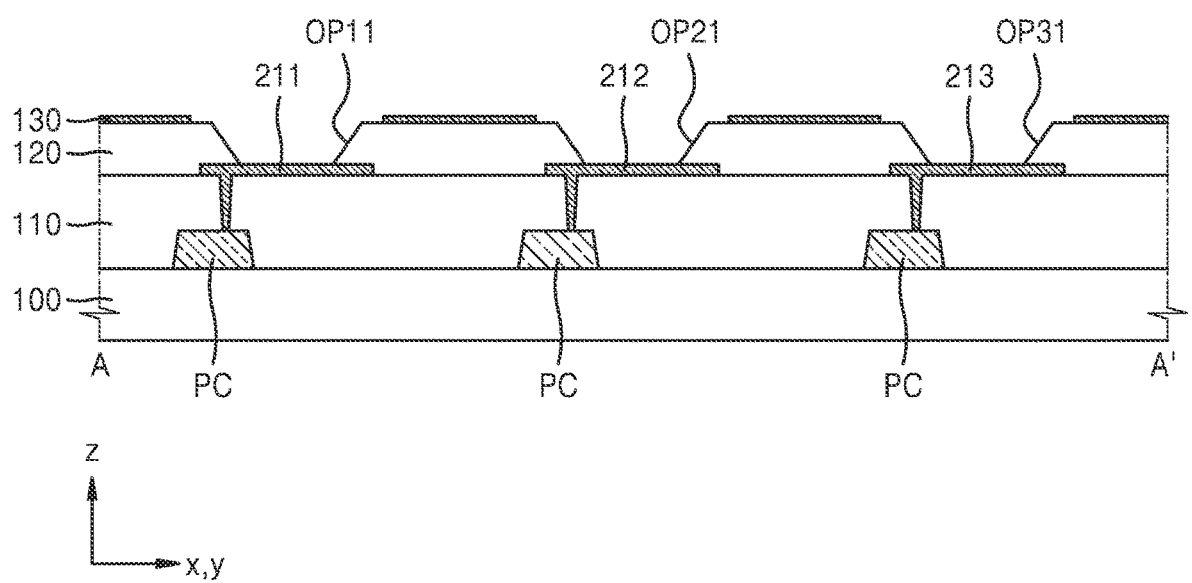
FIG. 3 is a cross-sectional view of a step of a manufacturing operation of a display apparatus according to an embodiment of the present disclosure.

FIG. 3 is a cross-sectional view illustrating a part of a manufacturing process of a display apparatus according to an embodiment, taken along line A-A' of FIG. 1.

Referring to FIG. 3, a pixel circuit PC used to drive each of the first through third pixels PX1, PX2, and PX3 is formed on the display area DA of the substrate 100. Although not illustrated in the drawing, a buffer layer (not shown) may be first formed on the substrate 100 before forming the pixel circuit PC. The pixel circuit PC may include the thin film transistors and the storage capacitor or the like described with reference to FIG. 2.

The substrate 100 may include a polymer resin such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), or the like.

A first insulating layer 110 is formed on the pixel circuit PC. The first insulating layer 110 may cover the pixel circuit PC and may be a planarization insulating layer providing a relatively planar surface. The first insulating layer 110 may include, for example, an organic insulating material such as PI.

Elements of the pixel circuit PC, for example a semiconductor layer of a thin film transistor, a gate electrode, a source electrode, a drain electrode, electrode plates of a storage capacitor, or the like may be formed between the substrate 100 and the first insulating layer 110. In addition, one or more inorganic and/or organic insulating layers that may be formed between a semiconductor layer of a thin film transistor and a gate electrode, between the gate electrode and a source or drain electrode, and between electrode plates of a storage capacitor may be further formed between the substrate 100 and the first insulating layer 110.

The first through third pixels PX1, PX2, and PX3 may include a first organic light-emitting diode OLED1 (see FIG. 7), a second organic light-emitting diode OLED2 (see FIG. 7), and a third organic light-emitting diode OLED3 (see FIG. 7), respectively, which are connected to pixel circuits PC.

First, as illustrated in FIG. 3, first through third pixel electrodes 211, 212, and 213 that are electrically connected to respective pixel circuits PC are formed on the first insulating layer 110. The first pixel electrode 211 may be for emission of the first color, the second pixel electrode 212 may be for emission of the second color, and the third pixel electrode 213 may be for emission of the third color. The first color, the second color, and the third color may be selected from a red color, a green color, a blue color, a white color, or a combination of thereof.

The first through third pixel electrodes 211, 212, and 213 are formed on the first insulating layer 110 by patterning them such that they are apart from each other. The first through third pixel electrodes 211, 212, and 213 may include a reflective layer including silver (Ag), magnesium (Mg), aluminum (Al), platinum (Pt), palladium (Pd), gold (Au), nickel (Ni), neodymium (Nd), iridium (Ir), chromium (Cr), and/or a compound thereof.

In some embodiments, the first through third pixel electrodes 211, 212, and 213 may include the above-described reflective layer and a transparent conductive oxide (TCO) layer on and/or under the above-described reflective layer. The TCO layer may include, for example, an indium tin oxide (ITO), an indium zinc oxide (IZO), a zinc oxide (ZnO), an indium oxide ($In_2O_3$), an indium gallium oxide (IGO), or an aluminum zinc oxide (AZO). For example, the first through third pixel electrodes 211, 212, and 213 may be a triple layer of ITO/Ag/ITO.

A second insulating layer 120 defining an emission area of each of the first through third pixel electrodes 211, 212, and 213 is formed on the first through third pixel electrodes 211, 212, and 213. Ends (e.g., edges) of the first through third pixel electrodes 211, 212, and 213 are covered by the second insulating layer 120, and openings respectively corresponding to pixels, for example, first through third openings OP11, OP21, and OP31 exposing center portions of the first through third pixel electrodes 211, 212, and 213, respectively, are formed in the second insulating layer 120 to thereby define pixels.

The second insulating layer 120 may be formed of, for example, an acrylic organic material or an organic insulating material such as benzocyclobutene (BCB). According to another embodiment, the second insulating layer 120 may be formed of an inorganic insulating material such as a silicon nitride (SiNx), a silicon oxide (SiOx), a silicon oxynitride (SiON), or a silicon oxycarbide (SiOC). When forming the second insulating layer 120 by using an inorganic insulating material, a path through which oxygen or moisture may penetrate may be blocked, thereby preventing or minimizing damage to an organic light-emitting diode due to oxygen or moisture.

An auxiliary electrode 130 is formed on the second insulating layer 120. The auxiliary electrode 130 may be formed on the second insulating layer 120 exclusively. The auxiliary electrode 130 may be formed directly on an upper surface of the second insulating layer 120 and be in direct contact with the upper surface of the second insulating layer 120. In some embodiments, the auxiliary electrode 130 may include a metal layer including a low-resistance metal, for example, molybdenum (Mo), titanium (Ti), copper (Cu), aluminum (Al), or an alloy thereof. In some embodiments, the auxiliary electrode 130 may further include a TCO layer such as ITO, on or under the above-described metal layer.

FIGS. 4A through 4D are cross-sectional views and a plan view illustrating a part (e.g., a step) of a manufacturing process of a display apparatus according to an embodiment of the present disclosure, illustrating operations performed, for example, to the embodiment of FIG. 3. FIGS. 4A through 4D illustrate a process of forming a first organic light-emitting diode OLED1 (see FIG. 7) corresponding to the first pixel electrode 211.

Figure 4A:
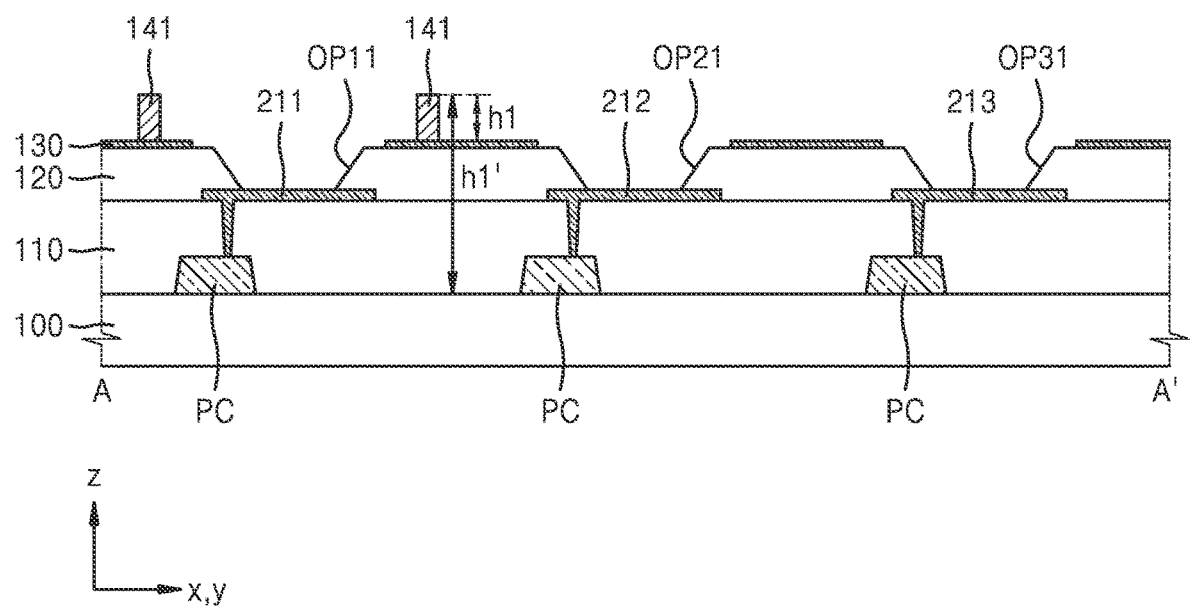
FIGS. 4A through 4D are cross-sectional views and a plan view of a step of a manufacturing process of a display apparatus according to an embodiment of the present disclosure.
Figure 4B:
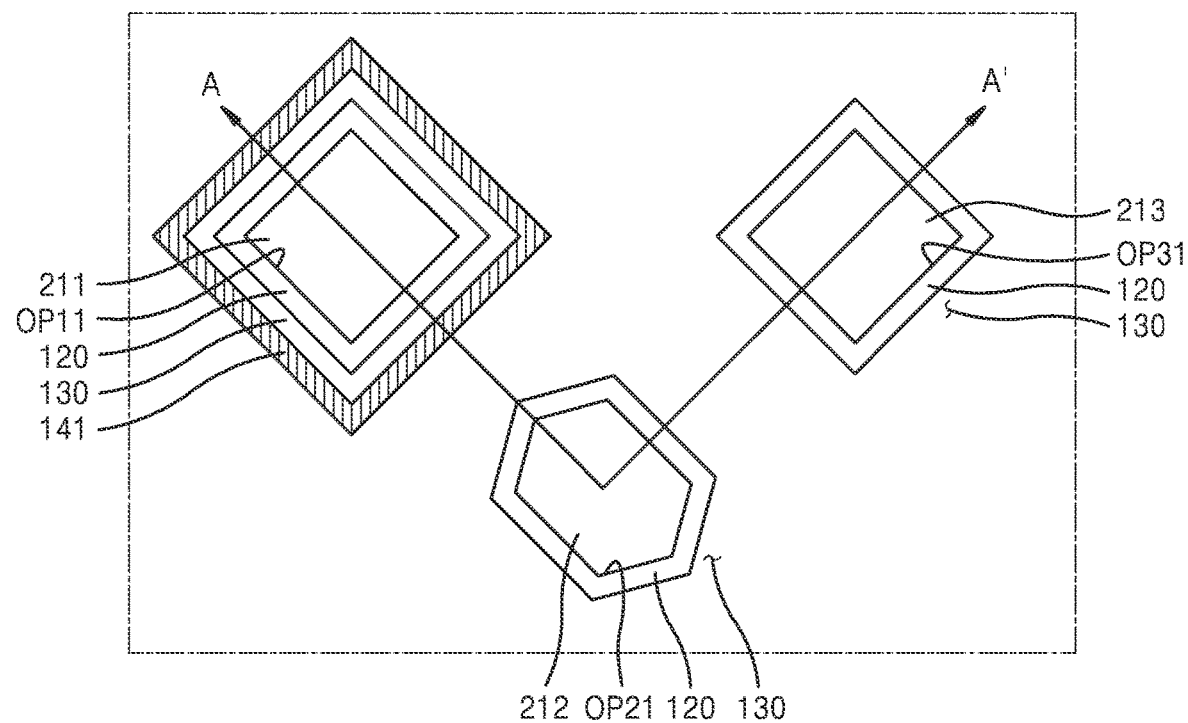

Referring to FIG. 4A, a first dam portion 141 is formed on the second insulating layer 120. The first dam portion 141 is formed directly on the auxiliary electrode 130 to surround an outer portion of a first opening OP11. FIG. 4B is a plan view which includes a portion corresponding to the first pixel electrode 211 of FIG. 4A. Referring to FIG. 4B, the first dam portion 141 may have a closed loop shape surrounding the first opening OP11. As described in detail below, the shape of the first dam portion 141 as described above may be configured to prevent a first lift-off layer 310 (FIG. 4C), which is to be formed around the outside of (e.g., at an outer portion of) the first dam portion 141, from reflowing and flowing toward and/or down into the first opening OP11.

The first dam portion 141 may be formed of, for example, a photosensitive resin; that is, a photoresist. According to an embodiment, a photosensitive resin layer (not shown) may be formed in the display area DA of the substrate 100, on which the second insulating layer 120 and the auxiliary electrode 130 are formed, and then the photosensitive layer may be exposed (e.g., partially exposed) and etched to thereby form the first dam portion 141 in an outer portion of the first opening OP11.

Figure 4C:
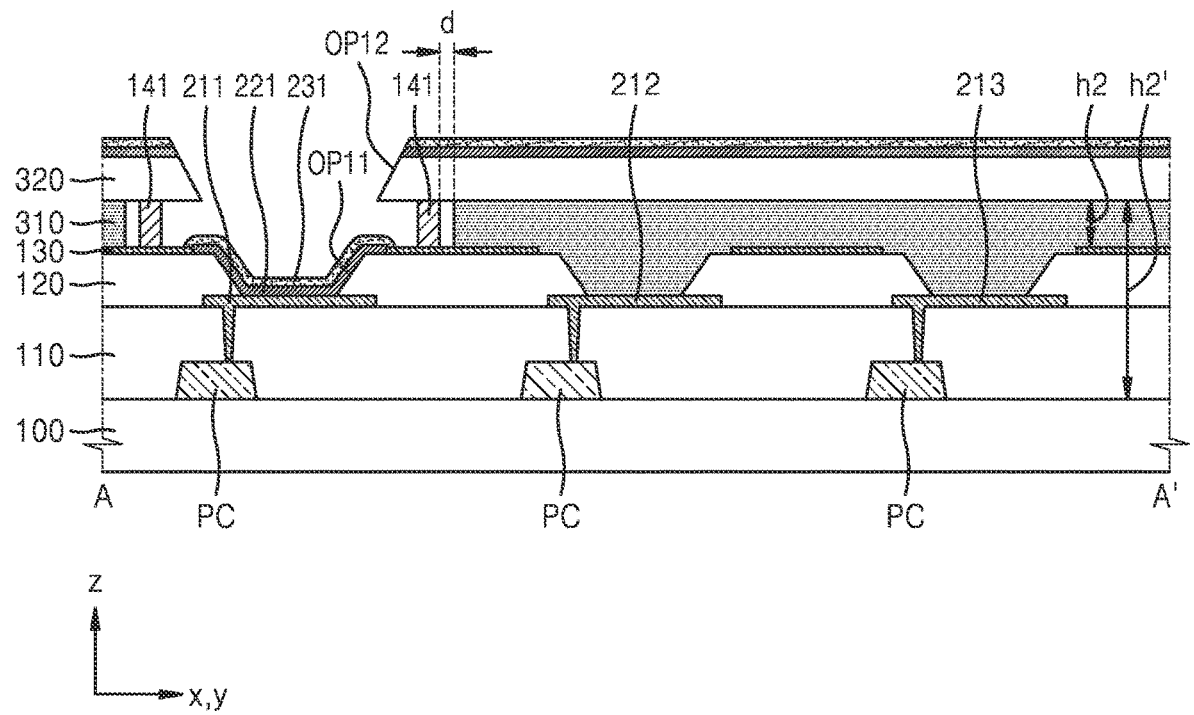

Next, referring to FIG. 4C, a first lift-off layer 310 and a first mask layer 320 are formed on the structure of FIG. 4A. An opening corresponding to the first pixel electrode 211 to expose the first pixel electrode 211 (e.g., a center portion of the first pixel electrode 211) is formed in each of the first lift-off layer 310 and the first mask layer 320, and the opening of the first lift-off layer 310 may be larger than the opening of the first mask layer 320. In addition, the area surrounded by the first dam portion 141 (i.e., the opening of the first dam portion 141) may also be larger than the opening of the first mask layer 320. That is, the first mask layer 320 may have an undercut shape in which the first mask layer 320 protrudes into the first opening OP11 more than the first dam portion 141 and the first lift-off layer 310 (e.g., protrudes beyond the first dam portion 141 toward the first opening OP11).

According to an embodiment, a non-photosensitive material layer (not shown) may be formed on the substrate 100 on which the auxiliary electrode 130 and the first dam portion 141 are formed, and then the non-photosensitive material layer may be selectively removed to pattern the first lift-off layer 310, and then a photosensitive resin layer (not shown) may be formed on the non-photosensitive material layer, and then the photosensitive resin layer may be exposed (e.g., partially exposed) and etched to form the first mask layer 320 having an opening.

The first lift-off layer 310 formed as described above is formed around the outside of (e.g., in an outer portion of) the first dam portion 141 and may be spaced apart from the first dam portion 141 by a distance d (e.g., a pre-set distance d), as illustrated in FIG. 4C. The space between the first dam portion 141 and the first lift-off layer 310 having the distance d may be due to, or may be implemented to account for, the difficulty in accurately aligning the first lift-off layer 310 with the first dam portion 141 in an operation of selectively removing the non-photosensitive material of the first lift-off layer 310.

According to another embodiment, a non-photosensitive material layer (not shown) and a photosensitive resin layer (not shown) may be formed on the substrate 100 on which the auxiliary electrode 130 and the first dam portion 141 are formed, and the photosensitive resin layer may be exposed (e.g., partially exposed) and etched to form the first mask layer 320 having an opening. Next, the non-photosensitive material layer may be selectively removed by using the first mask layer 320 to form the first lift-off layer 310 having an opening.

The first lift-off layer 310 formed as described above may be formed to be in contact with the first dam portion 141. As an opening is formed by exposing (e.g., partially exposing) and etching the photosensitive resin layer, and then the non-photosensitive material layer within the first dam portion 141 is selectively removed through the opening, the first dam portion 141 functions as a barrier, and a side surface of the first lift-off layer 310 may accordingly be in direct contact with a side surface of the first dam portion 141, that is, an outer side surface thereof.

The non-photosensitive material layer may be formed of a fluorous solvent base resin. For example, the non-photosensitive material layer may include 75-95 wt % of fluoro ether in which a portion of hydrogen is substituted with fluorine in an ether structure and 5-25 wt % of resin polymer, but the present disclosure is not limited thereto. When the non-photosensitive material layer includes the above-described material, the non-photosensitive material layer may be partially removed by using a stripper in a solution form including hydrofluoroether, thereby forming the first lift-off layer 310.

An opening exposing the first pixel electrode 211, that is, a first open portion OP12, is formed in the first mask layer 320. A first intermediate layer 221 and a first opposite electrode 231 are formed on the first pixel electrode 211 through the first open portion OP12. Materials of the first intermediate layer 221 and/or the first opposite electrode 231 may be formed not only on the first pixel electrode 211 but also on the first mask layer 320.

The first intermediate layer 221 may include an organic emissive layer and may further include a functional layer on and/or under the organic emissive layer. The functional layer may further include at least one of a hole injection layer, a hole transport layer, an electron transport layer, and an electron injection layer. The organic emissive layer may emit red, green or blue light.

The first opposite electrode 231 may be formed of a conductive material having a low work function. For example, the first opposite electrode 231 may include silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. According to an embodiment, the first opposite electrode 231 may include aluminum (Al), silver (Ag), and an alloy of Mg and Ag (Mg:Ag). In some embodiments, the first opposite electrode 231 may include an alloy containing more silver (Ag) than magnesium (Mg).

The first intermediate layer 221 and the first opposite electrode 231 may be formed using a thermal deposition method.

The first opposite electrode 231 patterned according to the first pixel electrode 211 may be electrically connected to an opposite electrode (for example, a second opposite electrode 232, see FIG. 5C) corresponding to an adjacent pixel electrode (for example, the second pixel electrode 212) through the auxiliary electrode 130. Each end of the first opposite electrode 231 may extend further than an end of the first intermediate layer 221 and be in direct contact with the auxiliary electrode 130. That is, a material of the first opposite electrode 231 may be deposited in a direction perpendicular to the substrate 100 or in an oblique direction with respect to the substrate 100, and thus, the first opposite electrode 231 may be formed to completely cover the first intermediate layer 221 in the opening of the first lift-off layer 310 and contact the auxiliary electrode 130.

Referring to FIGS. 4A and 4C together, a height h1 of the first dam portion 141 may be equal to a height h2 of the first lift-off layer 310. For example, a height h1' from an upper surface of the substrate 100 to an upper surface of the first dam portion 141 and a height h2' from the upper surface of the substrate 100 to an upper surface of the first lift-off layer 310 may be equal to each other. The first dam portion 141 may support the first mask layer 320 from below together with the first lift-off layer 310.

Figure 4D:
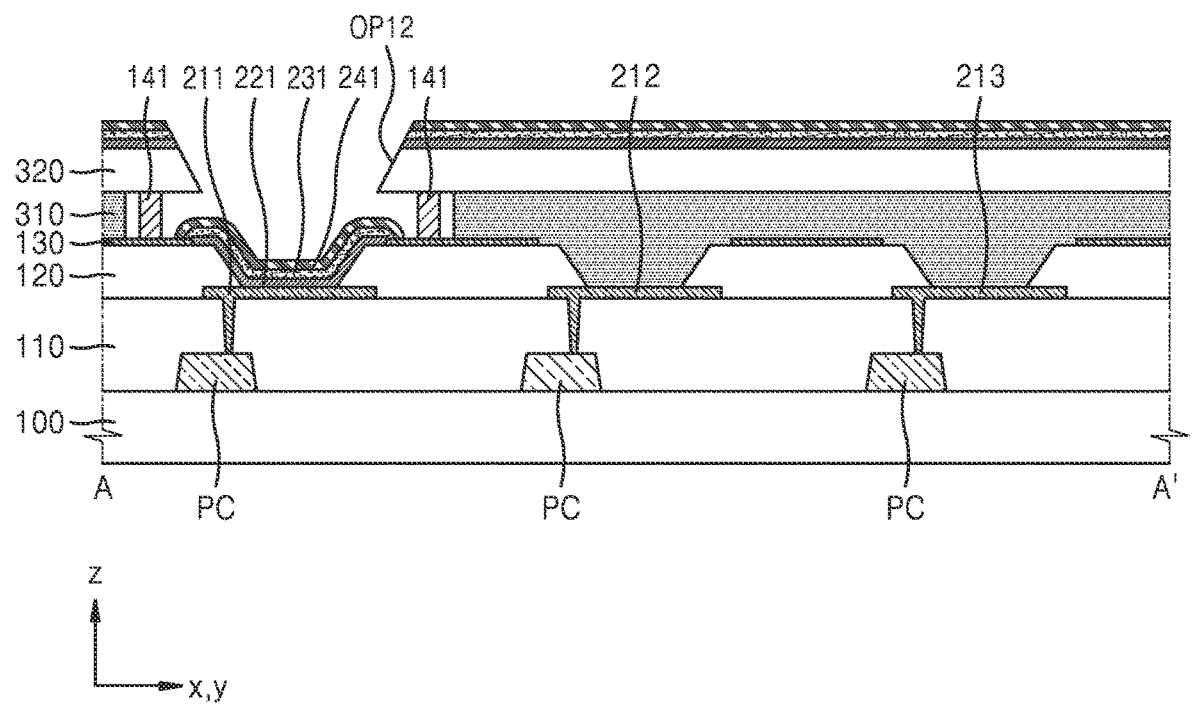

Next, referring to FIG. 4D, a first insulating protective layer 241 is formed on the first opposite electrode 231 through the first open portion OP12. Materials of the first insulating protective layer 241 may be formed not only on the first pixel electrode 211 but also on the first mask layer 320.

The first insulating protective layer 241 is formed on the first opposite electrode 231. The first insulating protective layer 241 completely covers the first opposite electrode 231 and may have a larger area than the first opposite electrode 231. An edge of the first insulating protective layer 241 may cover an edge (e.g., all edges) of the first opposite electrode 231 and be in direct contact with the auxiliary electrode 130. The first insulating protective layer 241 may include an inorganic insulating material such as a silicon nitride, a silicon oxide, or the like. An insulating protective layer such as the first insulating protective layer may protect layer(s) under the insulating protective layer, for example, an opposite electrode, an intermediate layer, or the like, during a process or after the process. The first insulating protective layer 241 may be formed using, for example, a chemical vapor deposition (CVD) method.

A high-temperature process may be performed when forming the first mask layer 320 and/or when forming the first intermediate layer 221, the first opposite electrode 231, and the first insulating protective layer 241 by using the first mask layer 320. For example, in a baking operation of the first mask layer 320 after exposing and etching the first mask layer 320, a high-temperature operation at about 70° C. or higher may be performed, and a deposition operation may be performed at about 80° C. or higher during an operation of forming the first opposite electrode 231 and the first insulating protective layer 241 after depositing the first intermediate layer 221.

In a structure without a first dam portion as a comparative example, a first lift-off layer located under a first mask layer is vulnerable to a high temperature due to characteristics of a material thereof, and thus may reflow in an undercut portion of the first mask layer, flowing down with the first mask layer. The material of the first lift-off layer of the structure without the dam portion may, therefore, migrate into an opening in the mask layer and may therefore interfere with formation and/or deposition of parts corresponding to the first opposite electrode, the first insulating protective layer, and the first intermediate layer.

However, according to the manufacturing method of the display apparatus of the present embodiment, the first dam portion 141 is formed to function as a barrier between the first opening OP11 and the first lift-off layer 310 to thereby effectively prevent or minimize reflowing of the first lift-off layer 310 during processes such as a high-temperature process.

After forming the first insulating protective layer 241, the first mask layer 320, the first lift-off layer 310, and the first dam portion 141 are removed. Here, the first mask layer 320, the first lift-off layer 310, and the first dam portion 141 may be simultaneously removed using an identical, first solution. As the first mask layer 320 and the first dam portion 141 may be formed using a same material, they may be simultaneously removed using an identical etching solution. 'Simultaneous' removal means that they are removed in a single operation. That is, the first mask layer 320, the first lift-off layer 310, and the first dam portion 141 are removed using an identical etching solution, and the first mask layer 320 and the first dam portion 141 formed using a same material may be etched first, and then the first lift-off layer 310 may be removed. The process described above also applies to embodiments of FIGS. 5D and 6D described below.

FIGS. 5A through 5D and FIGS. 6A through 6D are cross-sectional views and plan views of a part (e.g., a step) of a manufacturing process of a display apparatus according to embodiments of the present disclosure. While the process of FIGS. 4A through 4D described above correspond to the first pixel electrode 211, FIGS. 5A through 5D and FIGS. 6A through 6D may correspond to the second pixel electrode 212 and the third pixel electrode 213, respectively. In other words, the embodiment of FIGS. 4A through 4D may be understood as an operation of forming the first intermediate layer 221, the first opposite electrode 231, and the first insulating protective layer 241 on the first pixel electrode 211; the embodiment of FIGS. 5A through 5D may be understood as a process of forming a second intermediate layer 222, the second opposite electrode 232 and a second insulating protective layer 242 on the second pixel electrode 212; and the embodiment of FIGS. 6A through 6D may be understood as a process of forming a third intermediate layer 223, the third opposite electrode 233, and a third insulating protective layer 243 on the third pixel electrode 213. The process of FIGS. 4A through 4D corresponding to the first pixel electrode 211 may be repeated in the same manner with respect to the second pixel electrode 212 and the third pixel electrode 213 as illustrated in FIGS. 5A through 5D and FIGS. 6A through 6D. Thus, the process will now be described briefly and the description provided above with reference to FIGS. 4A through 4D will be referred regarding repeated description.

Figure 5A:
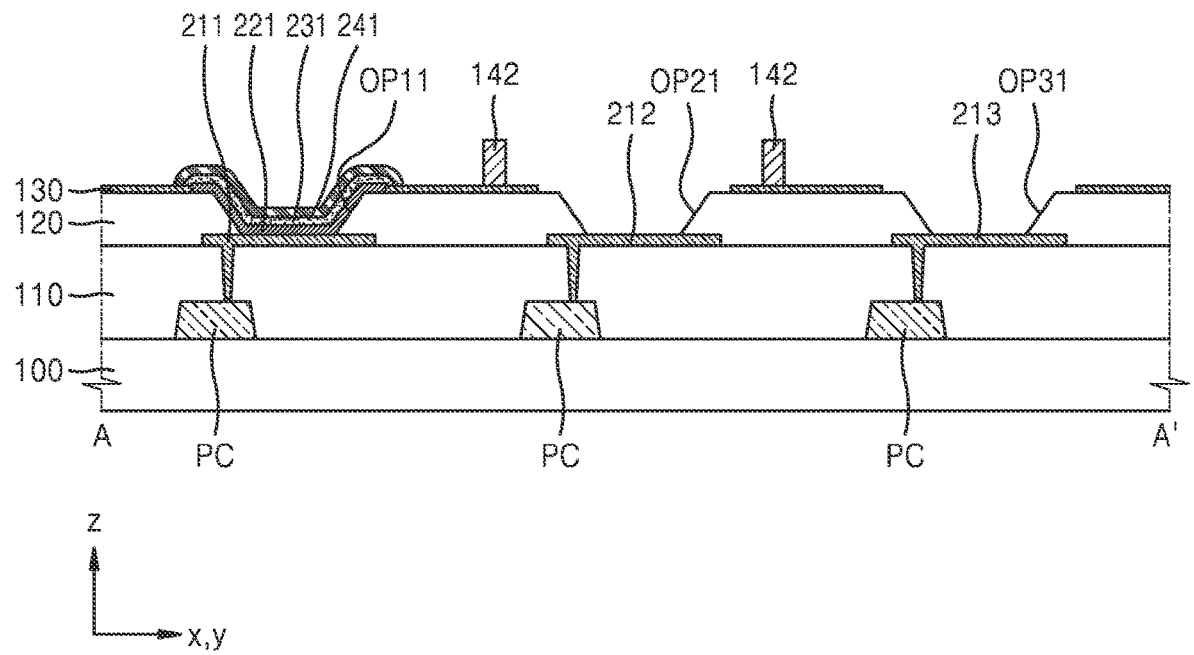
FIGS. 5A through 5D are cross-sectional views and a plan view of a step of a manufacturing process of a display apparatus according to an embodiment of the present disclosure.
Figure 5B:
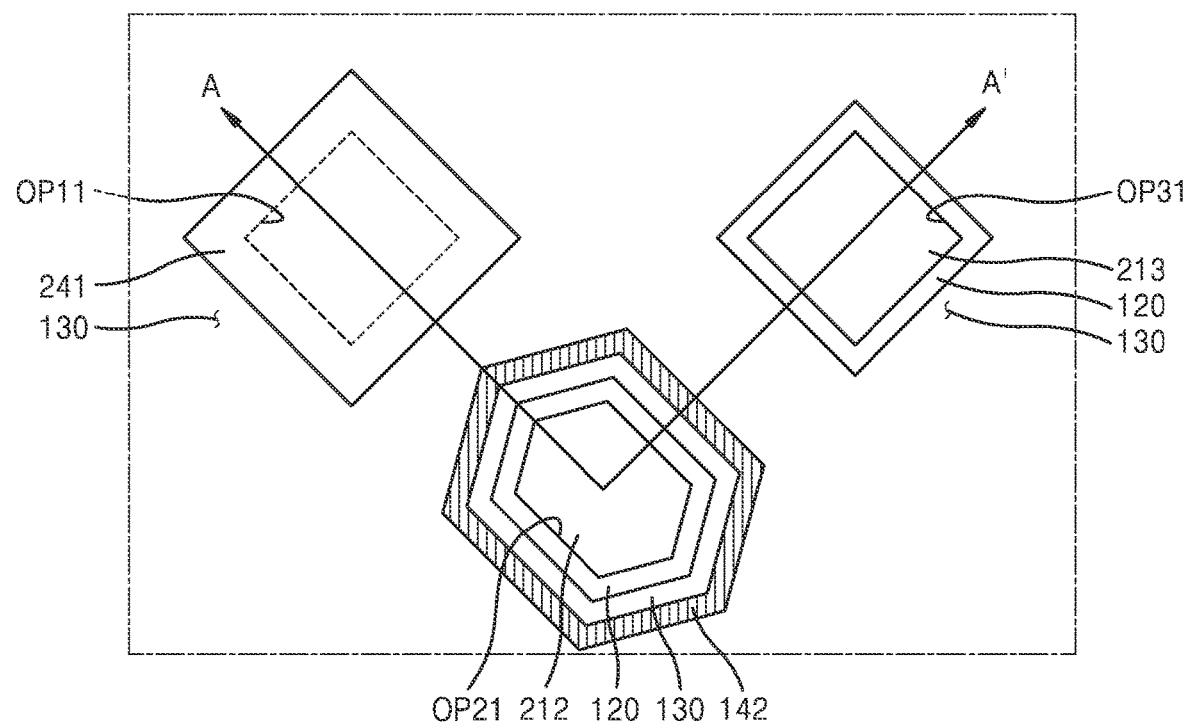
Figure 5C:
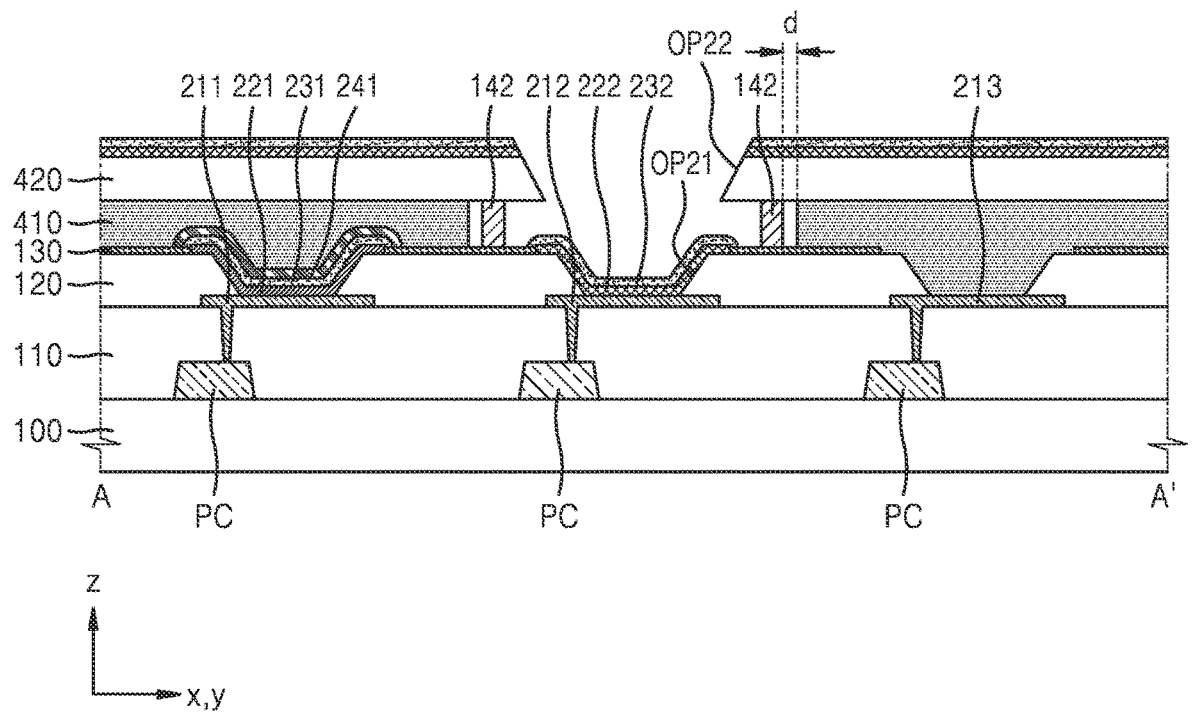
Figure 5D:
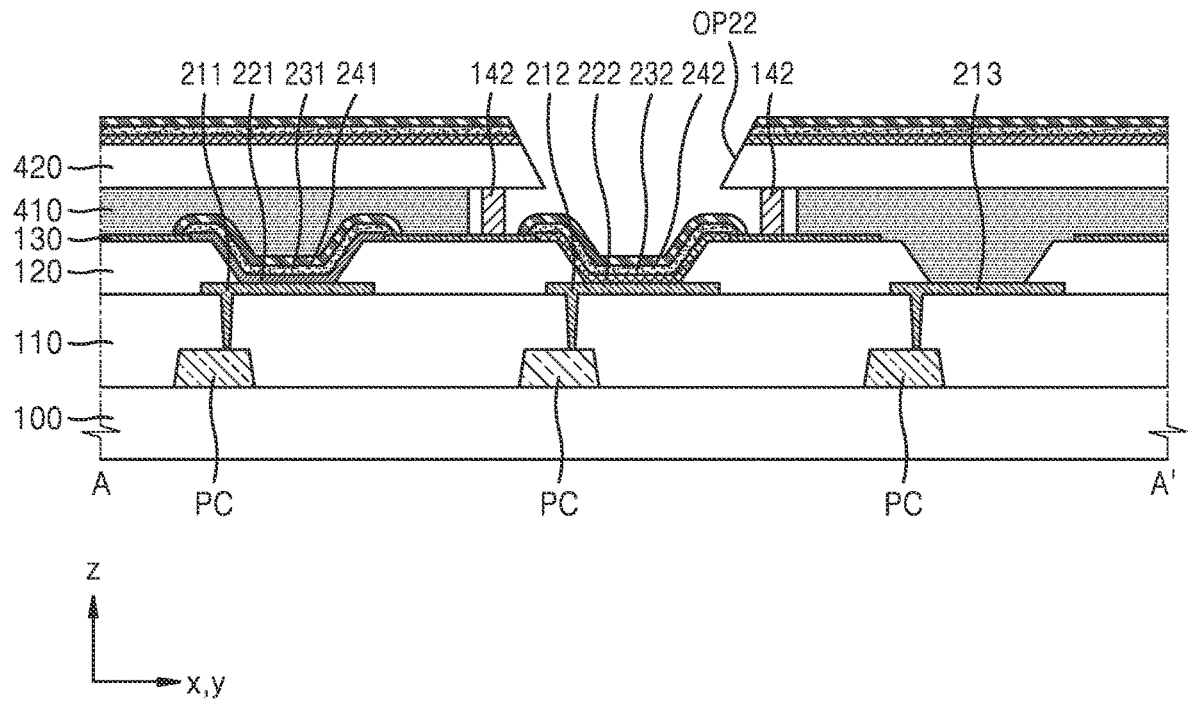

Referring to FIGS. 5A through 5D, first, a second dam portion 142 is formed on the second insulating layer 120. The second dam portion 142 is formed directly on the auxiliary electrode 130 around (e.g., to surround) an outer portion of a second opening OP21. The second dam portion 142 may have a closed loop shape surrounding the second opening OP21, as illustrated in FIG. 5B. The shape of the second dam portion 142 may be configured to prevent the second lift-off layer 410 (see FIG. 5C), which is to be formed around the outside of (e.g., at an outer portion of) the second dam portion 142, from reflowing and flowing toward and/or down into the second opening OP21.

The second dam portion 142 may be formed of, for example, a photosensitive resin; that is, a photoresist, and may include a same or similar material as a second mask layer 420 (see FIG. 5C) which will be described later. The method of forming the second dam portion 142 may be similar or identical to that of forming the first dam portion 141 described above.

Next, the second lift-off layer 410 and the second mask layer 420 are formed on the structure of FIG. 5A. The method of forming the second lift-off layer 410 and the second mask layer 420 may be similar or identical to that of forming the first lift-off layer 310 and the first mask layer 320 described above.

Figure 8:
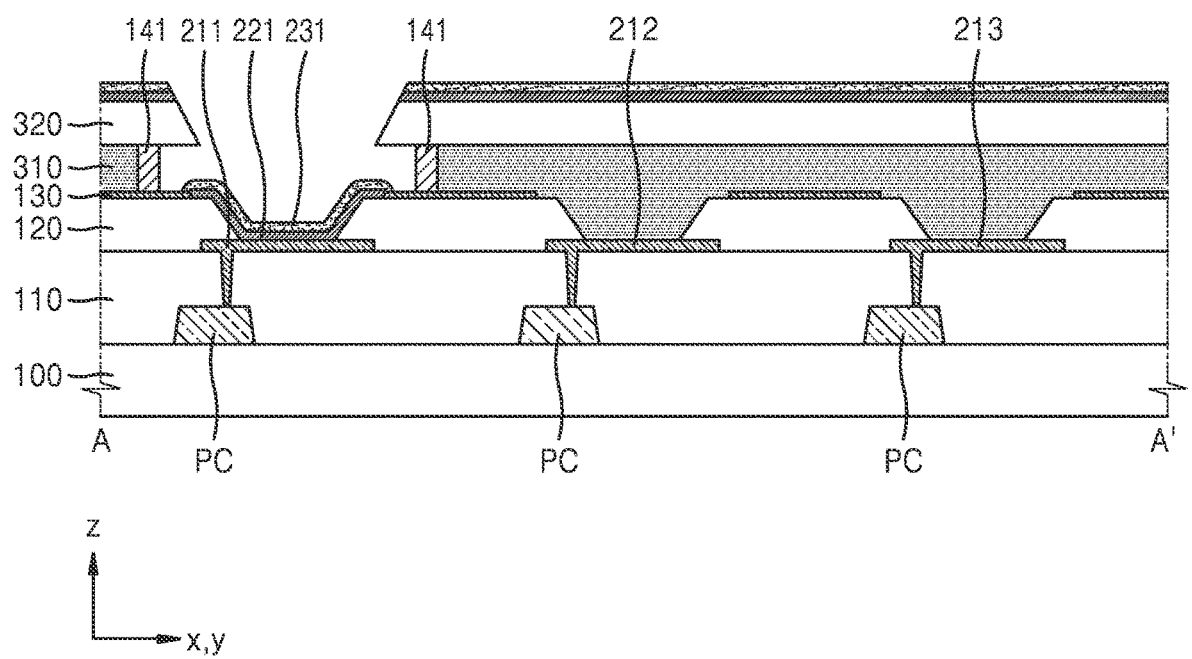
FIG. 8 is a cross-sectional view of a step of a manufacturing operation of a display apparatus according to another embodiment of the present disclosure.

While FIG. 5C illustrates a structure in which the second dam portion 142 is spaced apart from the second lift-off layer 410 by a distanced (e.g., a pre-set distance d) like in FIG. 4C, in some embodiments the second dam portion 142 may also contact the second lift-off layer 410 like the first dam portion 141 contacting the first lift-off layer 310 as illustrated in FIG. 8.

An opening exposing the second pixel electrode 212, that is, a second open portion OP22, is formed in the second mask layer 420. A second intermediate layer 222, a second opposite electrode 232, and a second insulating protective layer 242 may be sequentially formed on the second pixel electrode 212 through the second open portion OP22. Materials of the second intermediate layer 222, the second opposite electrode 232, and/or the second insulating protective layer 242 may be formed not only on the second pixel electrode 212 but also on the second mask layer 420. The second intermediate layer 222, the second opposite electrode 232, and the second insulating protective layer 242 may be patterned in approximately the same shape via the second open portion OP22.

An operation of forming the second mask layer 420 and/or forming the second intermediate layer 222, the second opposite electrode 232, and the second insulating protective layer 242 by using the second mask layer 420 may be performed at a high temperature. According to the manufacturing method of the display apparatus of the present embodiment, the second dam portion 142 is formed to function as a barrier between the second opening OP21 and the second lift-off layer 410 to thereby effectively prevent or minimize reflowing of the second lift-off layer 410 in a high-temperature process.

After forming the second insulating protective layer 242, the second mask layer 420, the second lift-off layer 410, and the second dam portion 142 are removed. Here, the second mask layer 420, the second lift-off layer 410, and the second dam portion 142 may be simultaneously removed using a similar or identical first solution. As the second mask layer 420 and the second dam portion 142 are formed using a same or similar material, they may be simultaneously removed using a similar or identical etching solution.

Referring to FIGS. 6A through 6D, a third dam portion 143 is formed directly on the auxiliary electrode 130 formed on the second insulating layer 120 in a same or similar manner as described above. The third dam portion 143 may have a closed loop shape surrounding an outer portion of a third opening OP31 as illustrated in the plan view of FIG.

6B. The third dam portion 143 may prevent a third lift-off layer 510 (see FIG. 6C) from reflowing and flowing toward and/or down into the third opening OP31.

The third dam portion 143 may be formed of, for example, a photosensitive resin—that is, a photoresist—and may include a same or similar material as a third mask layer 520 (see FIG. 6C) which will be described later. A method of forming the third dam portion 143 may be similar or identical to that of forming the first dam portion 141 and the second dam portion 142 described above.

Figure 6A:
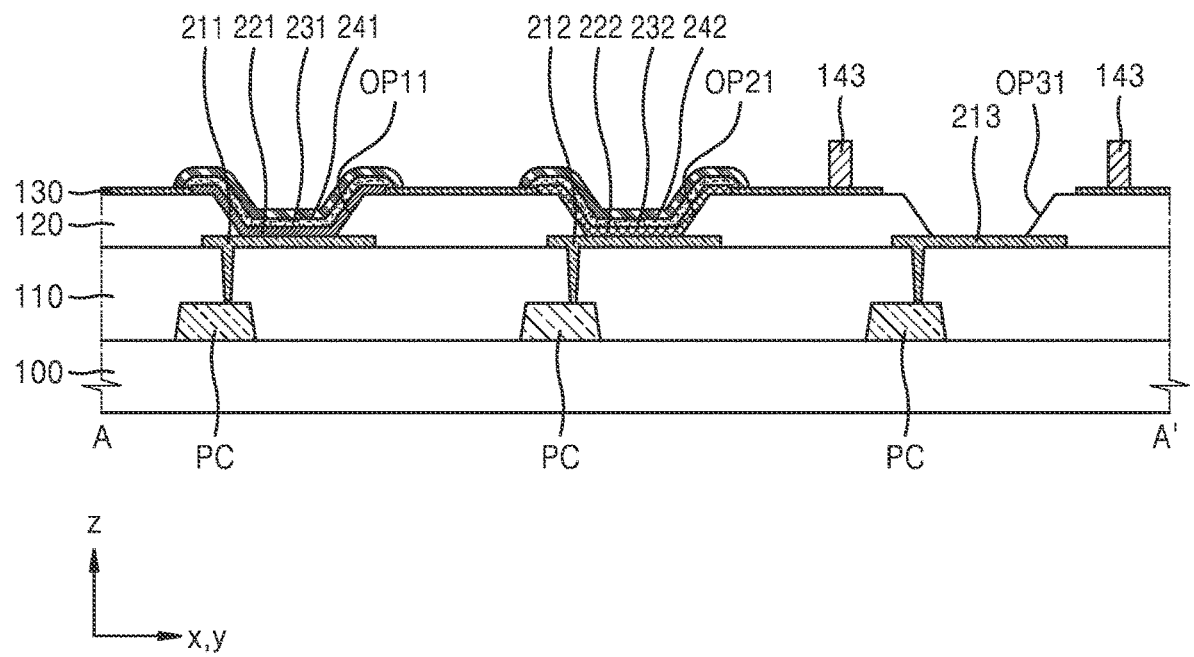
FIGS. 6A through 6D are cross-sectional views and a plan view of a step of a manufacturing process of a display apparatus according to an embodiment of the present disclosure.
Figure 6B:
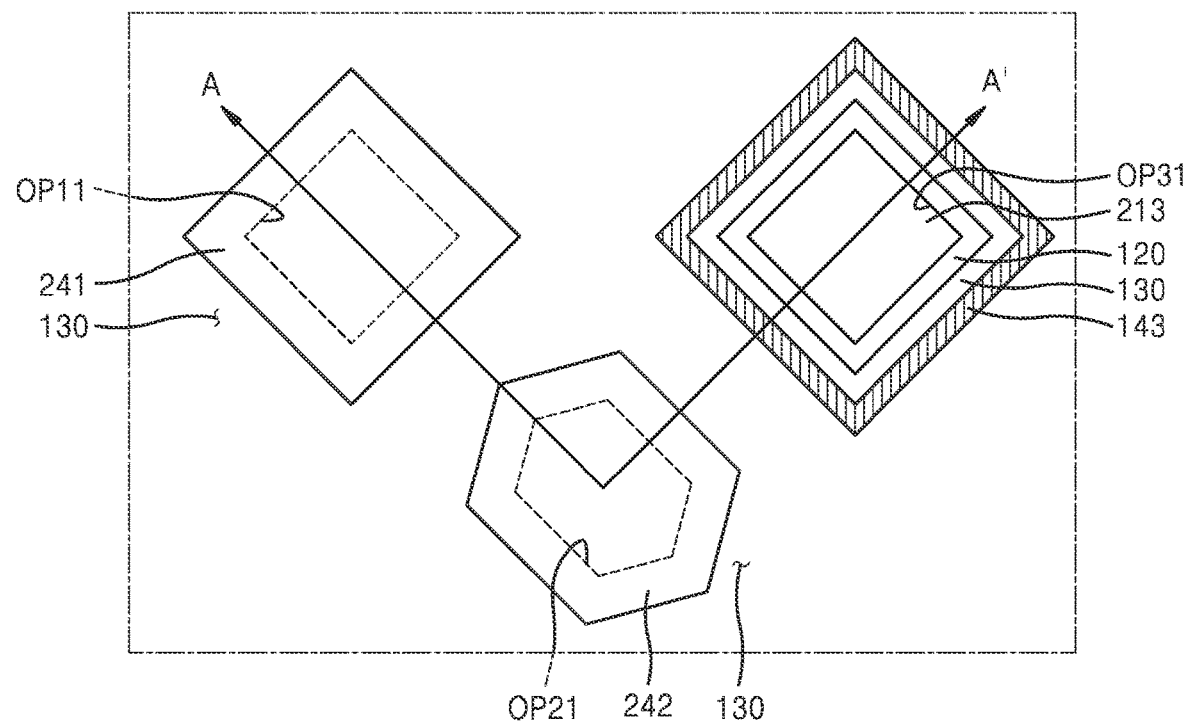

Next, the third lift-off layer 510 and the third mask layer 520 are formed on the structure of FIG. 6A. The method of forming the third lift-off layer 510 and the third mask layer 520 may be similar or identical to that of forming the first lift-off layer 310 and the first mask layer 320 described above.

Figure 6C:
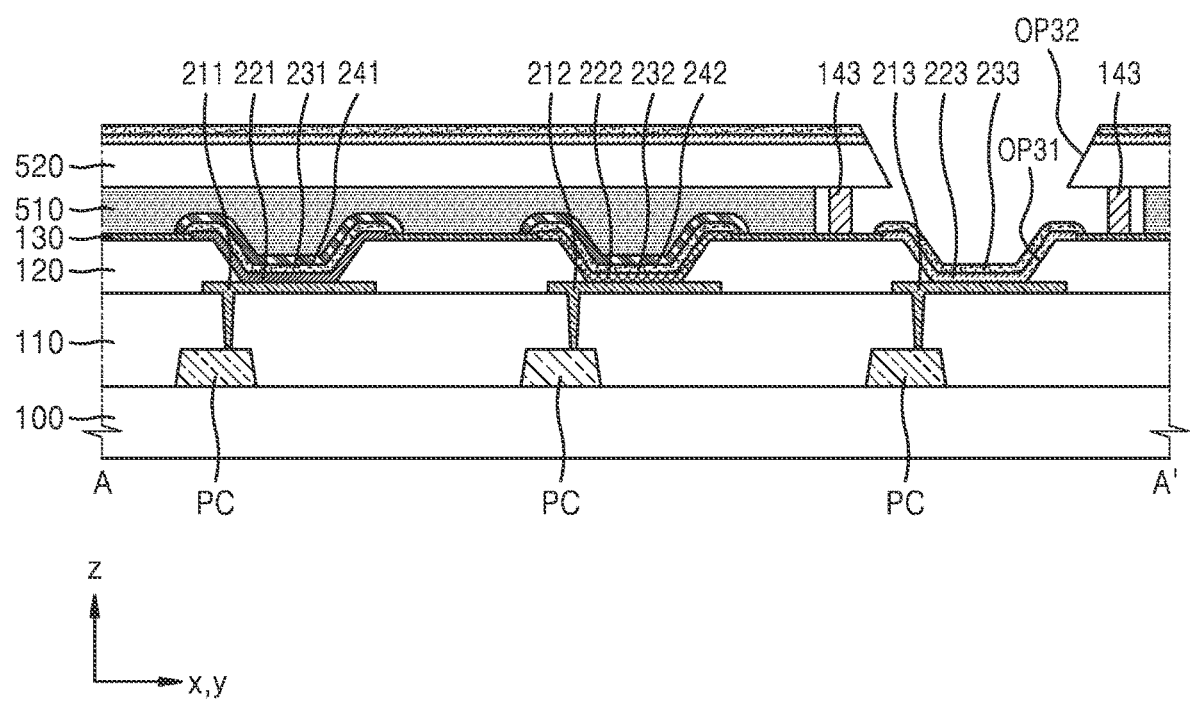
Figure 6D:
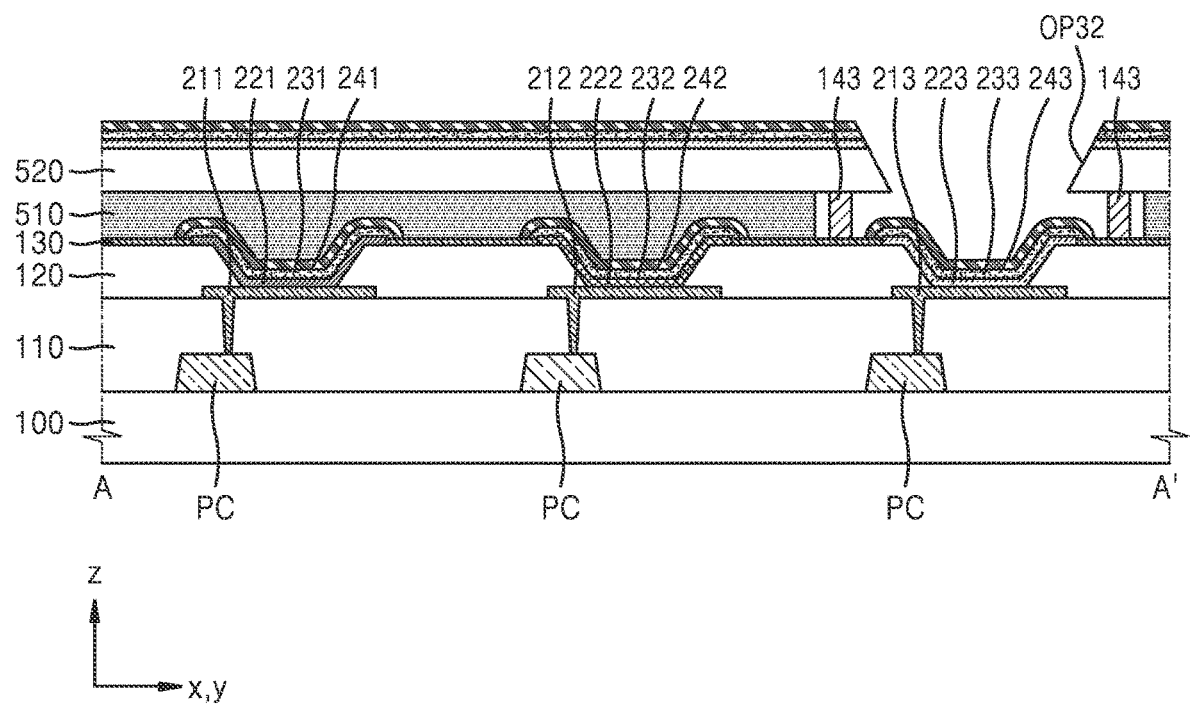

While FIG. 6C illustrates the structure in which the third dam portion 143 is spaced apart from the third lift-off layer 510 by a distance d (e.g., a pre-set distance d) like in FIG. 4C, in some embodiments the third dam portion 143 may also contact the third lift-off layer 510 like the first dam portion 141 contacting the first lift-off layer 310 as illustrated in FIG. 8.

An opening exposing the third pixel electrode 213, that is, a third open portion OP32, is formed in the third mask layer 520. A third intermediate layer 223, a third opposite electrode 233, and a third insulating protective layer 243 may be sequentially formed on the third pixel electrode 213 through the third open portion OP32. Materials of the third intermediate layer 223, the third opposite electrode 233, and/or the third insulating protective layer 243 may be formed not only on the third pixel electrode 213 but also on the third mask layer 520. The third intermediate layer 223, the third opposite electrode 233, and the third insulating protective layer 243 may be patterned in approximately the same shape via the third open portion OP32.

An operation of forming the third mask layer 520 and/or forming the third intermediate layer 223, the third opposite electrode 233, and the third insulating protective layer 243 by using the third mask layer 520 may be performed at a high temperature. According to the manufacturing method of the display apparatus of the present embodiment, the third dam portion 143 is formed to function as a barrier between the third opening OP31 and the third lift-off layer 510 to thereby effectively prevent or minimize reflowing of the third lift-off layer 510 in a high-temperature process.

After forming the third insulating protective layer 243, the third mask layer 520, the third lift-off layer 510, and the third dam portion 143 are removed. Here, the third mask layer 520, the third lift-off layer 510, and the third dam portion 143 may be simultaneously removed using a similar or identical first solution. As the third mask layer 520 and the third dam portion 143 are formed using a same or similar material, they may be simultaneously removed using a similar or identical etching solution.

Figure 7:
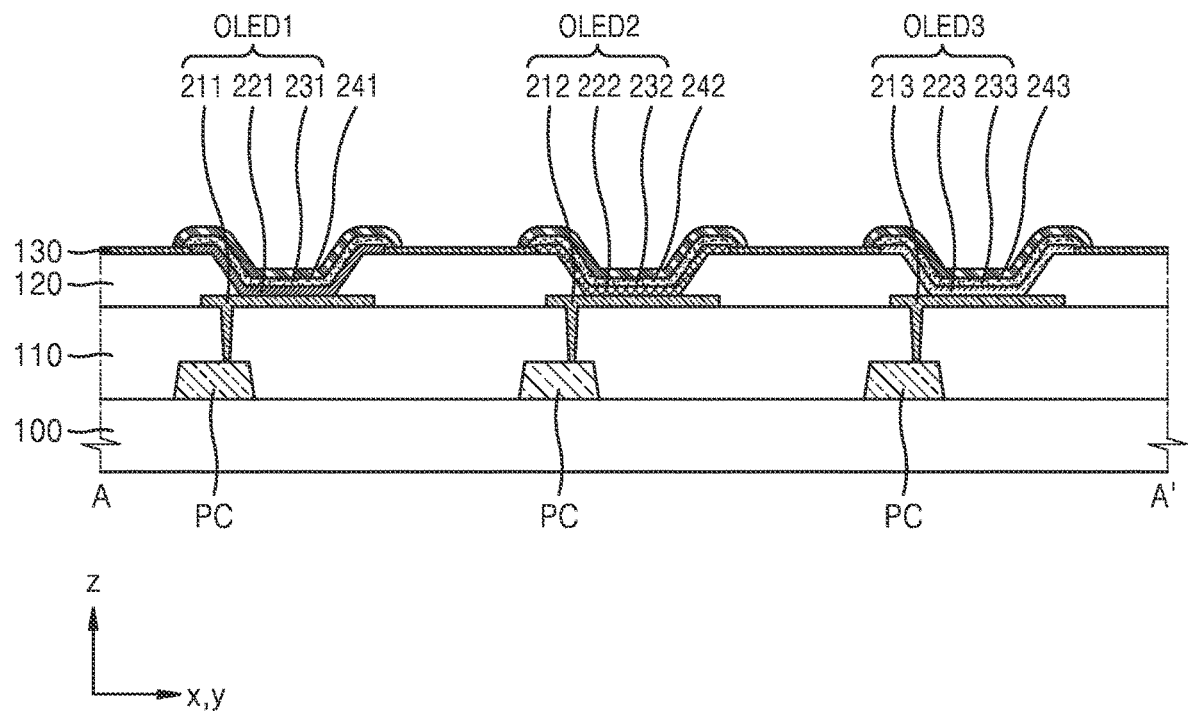
FIG. 7 is a cross-sectional view of a display apparatus according to an embodiment of the present disclosure.

FIG. 7 is a cross-sectional view of a display apparatus according to embodiments of the present disclosure. After removing the third mask layer 520, the third lift-off layer 510, and the third dam portion 143 from the embodiment of the display apparatus shown in FIG. 6D, the display apparatus according to the present embodiment may have a structure as illustrated in FIG. 7.

Figure 9:
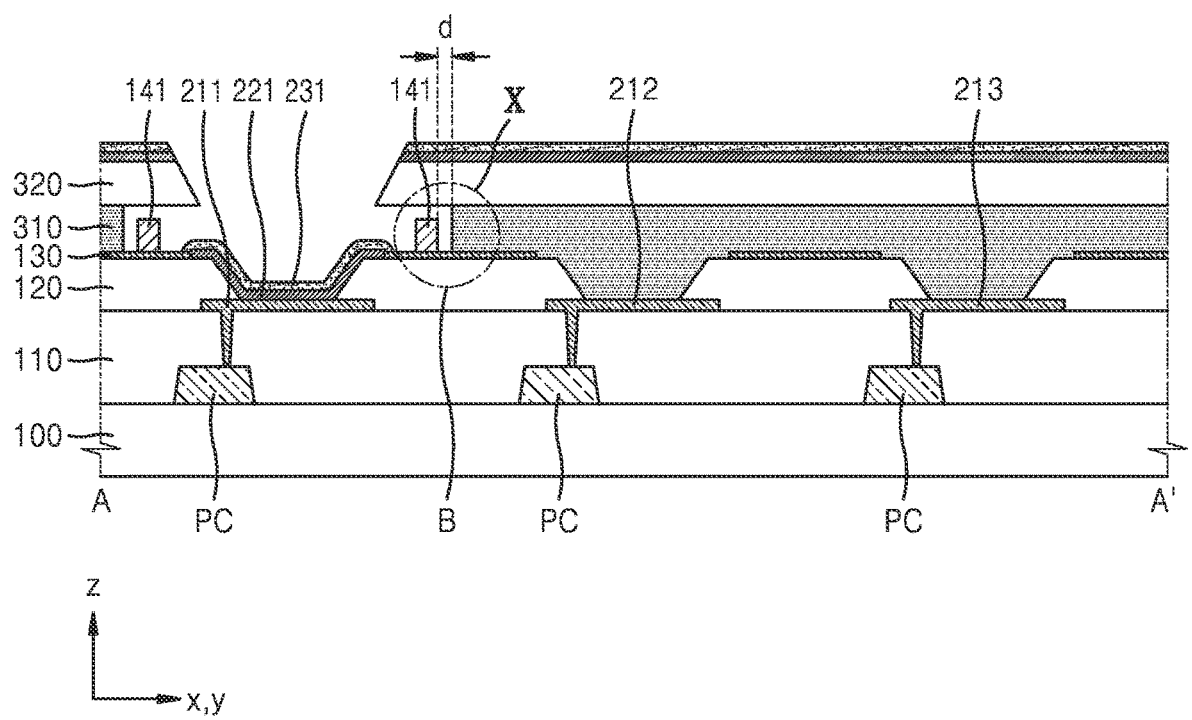
FIG. 9 is a cross-sectional view of a step of a manufacturing operation of a display apparatus according to another embodiment of the present disclosure.
Figure 10:
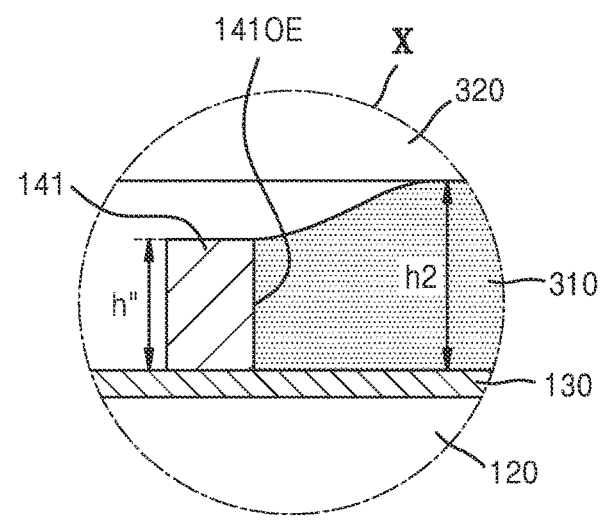
FIG. 10 is an enlarged view of a region B of FIG. 9.

FIG. 9 is a cross-sectional view illustrating a part (e.g., a step) of a manufacturing process of a display apparatus according to another embodiment of the present disclosure, and FIG. 10 is a schematic enlarged view of a region B of FIG. 9. FIG. 10 illustrates an operation in which the region B of FIG. 9 is deformed during a high-temperature process.

FIG. 9 corresponds to an alternative embodiment of the operation illustrated in FIG. 4C, in which a height h1" of the first dam portion 141 may be lower than (e.g., less than) the height h2 of the first lift-off layer 310. The height h1" of the first dam portion 141 may be understood as a height from an upper surface of the auxiliary electrode 130 to the upper surface of the first dam portion 141, and the height h2 of the first lift-off layer 310 may be understood as a height from the upper surface of the auxiliary electrode 130 to the upper surface of the first lift-off layer 310.

The first dam portion 141 functions as a barrier to prevent the first lift-off layer 310 from reflowing toward or into the first opening OP11 in a high-temperature process. The height h1" of the first dam portion 141 is sufficient to prevent reflowing of the first lift-off layer 310, and the height h1" of the first dam portion 141 does not necessarily have to be equal to the height h2 of the first lift-off layer 310.

Referring to FIG. 10, a portion of the first lift-off layer 310 may reflow during the high-temperature process. However, the first dam portion 141 having the height h1" may block the portion of the first lift-off layer 310 that reflows from passing the first dam portion 141. The first lift-off layer 310 having a portion that has reflowed to the first dam portion 141 may contact an outer external surface 141OE of the first dam portion 141. The height h1" of the first dam portion 141 may be varied according to design considerations of particular embodiments, and in some embodiments may be equal to or greater than ½ of the height h2 of the first lift-off layer 310.

In some embodiments, the first dam portion 141 and the first lift-off layer 310 may contact each other as illustrated in FIG. 8 as described above. In other embodiments, as depicted in FIG. 9, the first dam portion 141 and the first lift-off layer 310 may be spaced apart from each other by a distance d. As the height h1" of the first dam portion 141 is lower than the height h2 of the first lift-off layer 310, the space formed by the spacing apart of the first lift-off layer 310 and the first dam portion 141 may provide a space where portions of the first lift-off layer 310 that reflow may fill without passing the first dam portion 141.

Although the description with reference to FIGS. 9 and 10 was with respect to the first dam portion 141, the same may apply to the second dam portion 142 and the third dam portion 143.

While the manufacturing method of the display apparatus has been described above, the present disclosure is not limited thereto. For example, a display apparatus manufactured according to the manufacturing method of a display apparatus described above also falls within the scope of the present disclosure.

FIG. 7 is a schematic cross-sectional view of a display apparatus according to an embodiment of the present disclosure.

After removing the third mask layer 520, the third lift-off layer 510, and the third dam portion 143, the display apparatus according to the present embodiment may have a structure as illustrated in FIG. 7.

The first through third pixels PX1, PX2, and PX3 may include a first organic light-emitting diode OLED1, a second organic light-emitting diode OLED2, and a third organic light-emitting diode OLED3, respectively, that are connected to the pixel circuits PC. The first through third organic light-emitting diodes OLED1, OLED2, and OLED3 may each include a pixel electrode, an intermediate layer, and an opposite electrode. The first organic light-emitting diode OLED1 includes the first pixel electrode 211, the first intermediate layer 221, and the first opposite electrode 231. The second organic light-emitting diode OLED2 includes the second pixel electrode 212, the second intermediate layer 222, and the second opposite electrode 232. The third organic light-emitting diode OLED3 includes the third pixel electrode 213, the third intermediate layer 223, and the third opposite electrode 233.

The first intermediate layer 221 and the first opposite electrode 231 are patterned to correspond to the first pixel electrode 211, and the second intermediate layer 222 and the second opposite electrode 232 are patterned to correspond to the second pixel electrode 212, and the third intermediate layer 223 and the third opposite electrode 233 are patterned to correspond to the third pixel electrode 213.

Although the first through third opposite electrodes 231, 232, and 233 patterned in accordance with the first through third pixel electrodes 211, 212, and 213, respectively, are spaced apart from each other, the first through third opposite electrodes 231, 232, and 233 may be electrically connected to each other via the auxiliary electrode 130. Ends of the first through third intermediate layers 221, 222, and 223 may extend further than the ends of the first through third intermediate layers 221, 222, and 223 to directly contact the auxiliary electrode 130.

The first through third insulating protective layers 251, 252, and 253 are located on the first through third opposite electrodes 231, 232, and 233, respectively. The first through third insulating protective layers 251, 252, and 253 are spaced apart from each other, and may be respectively patterned on the first through third opposite electrodes 231, 232, and 233. The first through third insulating protective layers 251, 252, and 253 may completely cover the first through third opposite electrodes 231, 232, and 233, respectively. Widths of the first through third insulating protective layers 251, 252, and 253 may be greater than widths of the first through third opposite electrodes 231, 232, and 233.

According to embodiments of the present disclosure, a manufacturing method of a display apparatus may be implemented in which a defect rate in a manufacturing process is reduced and product reliability is increased. Further, according to embodiments of the present disclosure, a display apparatus amenable to being manufactured using a method in which a defect rate is reduced and product reliability is increased may be implemented. The scope of the present disclosure is not limited by the above-described effects.

It should be understood that embodiments described herein should be considered in a descriptive sense only and not for purposes of limitation. Descriptions of features or aspects within each embodiment should typically be considered as available for other similar features or aspects in other embodiments.

While embodiments of the present disclosure have been described with reference to the figures, it will be understood by those of ordinary skill in the art that various changes in form and details may be made therein without departing from the spirit and scope of the present disclosure, and that such embodiments should therefore not be understood to narrow the scope of the invention as defined by the following claims and equivalents thereof.

What is claimed is:

1. A method of manufacturing a display apparatus, the method comprising:
   forming a first pixel electrode for emission of a first color on a substrate;
   forming an insulating layer, the insulating layer covering edges of the first pixel electrode, and defining a first opening exposing a center portion of the first pixel electrode;
   forming a first dam portion on the insulating layer around the first opening;
   forming a first lift-off layer on the insulating layer around an outside of the first dam portion and defining an opening exposing the first pixel electrode;
   forming a first mask layer on the first lift-off layer, the first mask layer defining a first open portion corresponding to the first opening;
   forming a first intermediate layer on the first pixel electrode through the first open portion;
   forming a first opposite electrode on the first intermediate layer through the first open portion;
   forming a first insulating protective layer on the first opposite electrode through the first open portion; and
   removing the first mask layer, the first lift-off layer, and the first dam portion.

2. The method of claim 1, wherein the first dam portion and the first mask layer comprise a same material.

3. The method of claim 1, wherein the removing of the first mask layer, the first lift-off layer, and the first dam portion comprises concurrently removing the first mask layer, the first lift-off layer, and the first dam portion using a first solution.

4. The method of claim 1, wherein a height of the first dam portion is equal to a height of the first lift-off layer.

5. The method of claim 1, wherein an edge of the first mask layer around the first open portion has an undercut shape protruding beyond the first dam portion toward the first opening.

6. The method of claim 5, wherein an upper surface of the first dam portion contacts a lower surface of the first mask layer such that the first dam portion supports the first mask layer from below.

7. The method of claim 1, wherein the first dam portion and the first lift-off layer are spaced apart from each other.

8. The method of claim 1, further comprising, before forming the first dam portion, patterning an auxiliary electrode on the insulating layer.

9. The method of claim 8, wherein the first opposite electrode directly contacts the auxiliary electrode to electrically connect to the auxiliary electrode.

10. The method of claim 1, wherein the first insulating protective layer comprises an inorganic insulating material.

11. The method of claim 10, wherein an end of the first insulating protective layer is spaced apart from the first dam portion.

12. The method of claim 1, wherein a height of the first dam portion is less than a height of the first lift-off layer.

13. The method of claim 1, wherein the first dam portion and the first mask layer contact each other.

14. The method of claim 1, wherein the first lift-off layer comprises a fluorous solvent base resin.

15. The method of claim 1, wherein the first dam portion has a closed loop shape surrounding the first opening.

16. The method of claim 1, further comprising, after removing the first mask layer, the first lift-off layer, and the first dam portion:
   forming a second pixel electrode for emission of a second color;
   forming the insulating layer covering edges of the second pixel electrode, and defining a second opening exposing a center portion of the second pixel electrode;

forming a second dam portion on the insulating layer around the second opening;

forming a second lift-off layer on the insulating layer around an outside of the second dam portion, and defining an opening exposing the second pixel electrode;

forming a second mask layer on the second lift-off layer, the second mask layer having a second open portion corresponding to the second opening;

forming a second intermediate layer on the second pixel electrode through the second open portion;

forming a second opposite electrode on the second intermediate layer through the second open portion;

forming a second insulating protective layer on the second opposite electrode through the second open portion; and concurrently removing the second mask layer, the second lift-off layer, and the second dam portion by using an identical etching solution.

17. The method of claim 16, further comprising, after removing the second mask layer, the second lift-off layer, and the second dam portion:

forming a third pixel electrode for emission of a third color on the substrate;

forming the insulating layer covering edges of the third pixel electrode, and defining a third opening exposing a center portion of the third pixel electrode;

forming a third dam portion on the insulating layer around the third opening;

forming a third lift-off layer on the insulating layer around an outside of the third dam portion, and defining an opening exposing the third pixel electrode;

forming a third mask layer on the third lift-off layer, the third mask layer having a third open portion corresponding to the third opening;

forming a third intermediate layer on the third pixel electrode through the third open portion;

forming a third opposite electrode on the third intermediate layer through the third open portion;

(f-3) forming a third insulating protective layer on the third opposite electrode through the third open portion; and concurrently removing the third mask layer, the third lift-off layer, and the third dam portion by using an identical etching solution.

18. The method of claim 17, in step wherein, in the forming the first lift-off layer on the insulating layer, the first lift-off layer covers an upper portion of the second pixel electrode and an upper portion of the third pixel electrode.

19. The method of claim 17, in wherein, in the forming the second lift-off layer on the insulating layer, the second lift-off layer covers an upper portion of the first pixel electrode and an upper portion of the third pixel electrode.

20. The method of claim 17, in step wherein, in the forming the third lift-off layer on the insulating layer, the third lift-off layer covers an upper portion of the first pixel electrode and an upper portion of the second pixel electrode.

* * * * *